US010121736B2

United States Patent
Lin et al.

(10) Patent No.: US 10,121,736 B2
(45) Date of Patent: Nov. 6, 2018

(54) METHOD OF FABRICATING PACKAGING LAYER OF FAN-OUT CHIP PACKAGE

(71) Applicant: Powertech Technology Inc., Hsinchu County (TW)

(72) Inventors: Kuo-Ting Lin, Hsinchu County (TW); Chia-Wei Chang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/876,210

(22) Filed: Jan. 22, 2018

(65) Prior Publication Data

US 2018/0145015 A1    May 24, 2018

Related U.S. Application Data

(62) Division of application No. 15/245,605, filed on Aug. 24, 2016, now Pat. No. 9,899,307.

(30) Foreign Application Priority Data

Dec. 23, 2015   (TW) .............................. 104143306 A

(51) Int. Cl.
*H01L 23/498*    (2006.01)
*H01L 23/00*    (2006.01)
(Continued)

(52) U.S. Cl.
CPC ...... *H01L 23/49827* (2013.01); *H01L 21/486* (2013.01); *H01L 21/568* (2013.01);
(Continued)

(58) Field of Classification Search
CPC ............... H01L 23/49827; H01L 24/19; H01L 23/49811; H01L 23/5389; H01L 25/0657; H01L 23/49816; H01L 24/02; H01L 24/13; H01L 21/568; H01L 21/486; H01L 2224/32225; H01L 2224/18; H01L 2224/04105; H01L 2924/18162; H01L 2224/73267; H01L 2224/02379;
(Continued)

(56) References Cited

U.S. PATENT DOCUMENTS

2013/0249106 A1 *   9/2013   Lin .......................... H01L 24/19
                                                  257/774
2015/0259194 A1 *   9/2015   Lin .......................... B81B 7/007
                                                  257/773

* cited by examiner

*Primary Examiner* — Su C Kim
(74) *Attorney, Agent, or Firm* — JCIPRNET

(57) ABSTRACT

A method of fabricating a packaging layer of an fan-out chip package comprising: disposing a chip on a temporary carrier; forming an encapsulation on the temporary carrier to encapsulate the chip; grinding the encapsulation and the chip to form a back surface of the chip and a back surface of the encapsulation; debonding the encapsulation and the chip from the temporary carrier; forming a first passivation layer on the active surface of the chip and the peripheral surface of the encapsulation; patterning the first passivation layer to form fan-in openings and fan-out openings on the first passivation layer; forming a redistribution layer on the first passivation layer; forming a second passivation layer on the first passivation layer and the redistribution wiring layer; forming vertical connectors within the encapsulation to correspondingly couple to the fan-out pads; and disposing a plurality of dummy terminals on the dummy pattern.

8 Claims, 11 Drawing Sheets

(51) Int. Cl.
*H01L 21/48* (2006.01)
*H01L 21/56* (2006.01)
*H01L 25/065* (2006.01)
*H01L 23/538* (2006.01)

(52) U.S. Cl.
CPC .. *H01L 23/49811* (2013.01); *H01L 23/49816* (2013.01); *H01L 23/5389* (2013.01); *H01L 24/02* (2013.01); *H01L 24/13* (2013.01); *H01L 24/19* (2013.01); *H01L 25/0657* (2013.01); *H01L 2224/02379* (2013.01); *H01L 2224/02381* (2013.01); *H01L 2224/04105* (2013.01); *H01L 2224/12105* (2013.01); *H01L 2224/13024* (2013.01); *H01L 2224/13027* (2013.01); *H01L 2224/18* (2013.01); *H01L 2224/32225* (2013.01); *H01L 2224/73267* (2013.01); *H01L 2225/06548* (2013.01); *H01L 2225/1058* (2013.01); *H01L 2924/1816* (2013.01); *H01L 2924/18162* (2013.01)

(58) Field of Classification Search
CPC ... H01L 2225/1058; H01L 2224/13027; H01L 2225/06548; H01L 2924/1816; H01L 2224/13024; H01L 2224/02381
See application file for complete search history.

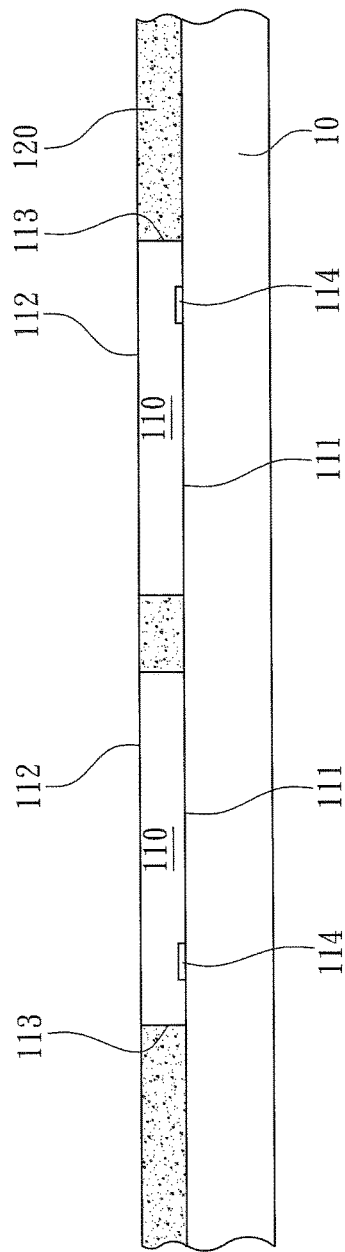
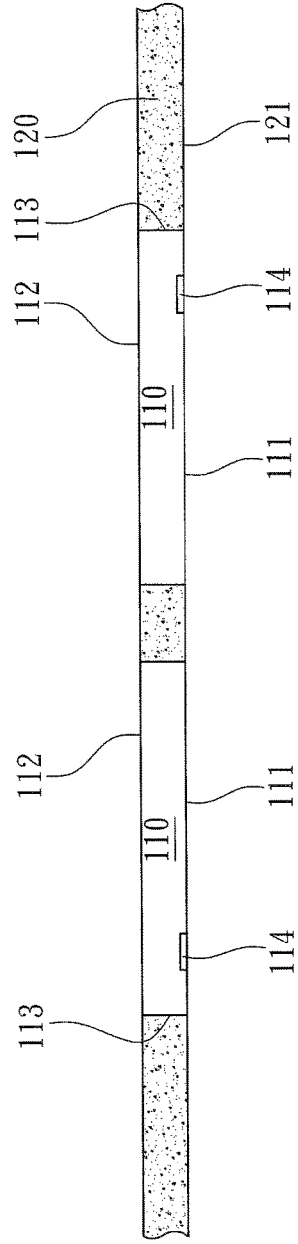
FIG. 3C
FIG. 3D

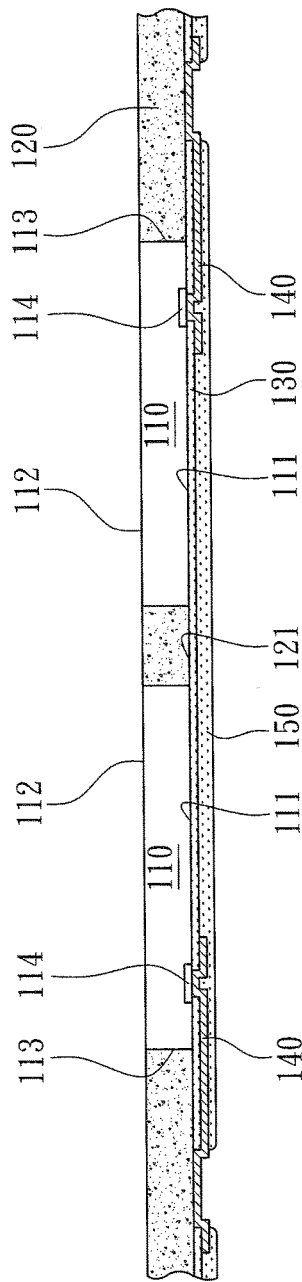
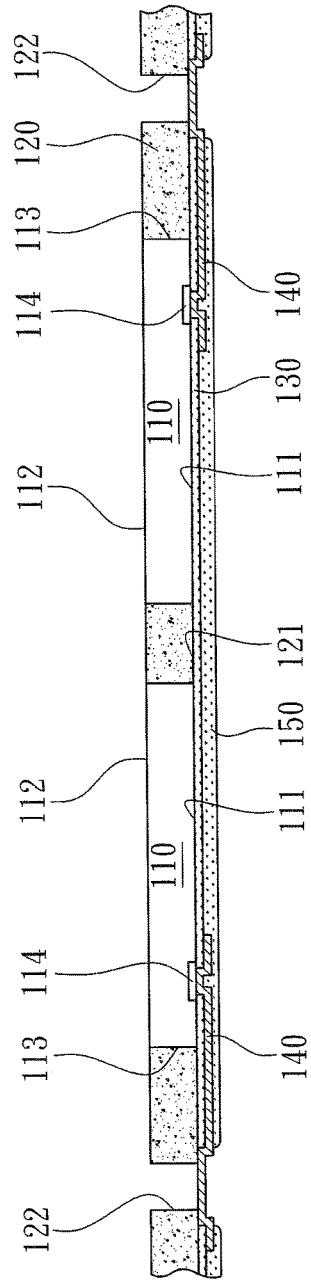
FIG. 3G
FIG. 3H

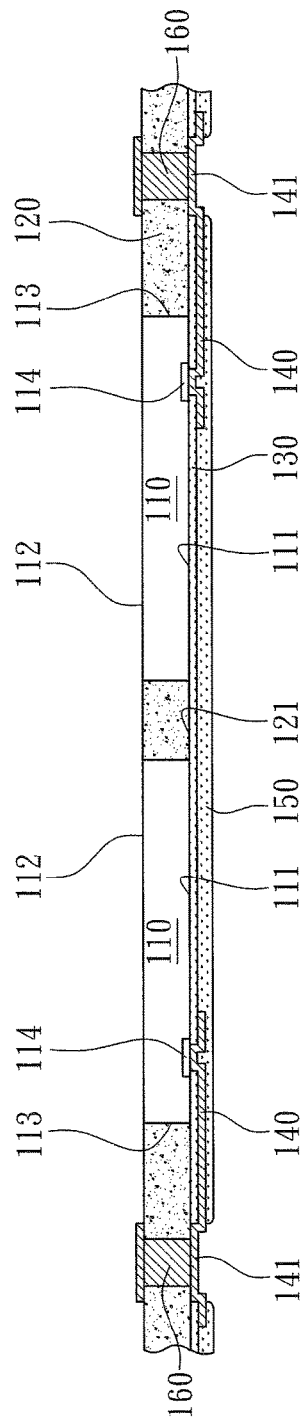

METHOD OF FABRICATING PACKAGING LAYER OF FAN-OUT CHIP PACKAGE

CROSS-REFERENCE TO RELATED APPLICATION

This application is a divisional application of and claims the priority benefit of U.S. application Ser. No. 15/245,605, filed on Aug. 24, 2016, now allowed, which claims the priority benefit of Taiwan application serial no. 104143306, filed on Dec. 23, 2015. The entirety of each of the abovementioned patent applications is hereby incorporated by reference herein and made a part of specification.

FIELD OF THE INVENTION

The present invention relates to a semiconductor package and more specifically to a fan-out chip package and its fabricating method.

BACKGROUND OF THE INVENTION

As semiconductor packaging technology develops toward miniaturization and high-density stacking, designs of semiconductor packages are starting to include implementation of redistribution layers for electrical connection of internal elements. Such semiconductor packages include wafer-level fan-out chip packages and panel-level fan-out chip packages. Fan-out chip packages can eliminate the thickness of the substrate. The fabrication process of the redistribution layer may be integrated in wafer-level packaging process or panel-level packaging process. As compared to conventional chip packaging process, the molding process is executed before the circuit is formed.

In conventional face-down fan-out chip packages, redistribution layers are fabricated on a surface of the encapsulation and on active surfaces of chips simultaneously. The circuitry of a redistribution layer may fan-out outside a chip area. However, the circuitry of the redistribution layer is vulnerable to cracking. Furthermore, when fan-out chip packages are implemented for 3D package stacking products such as Package-On-Package (POP) products, the requirements of the total package thickness is continuously increasing.

SUMMARY OF THE INVENTION

The objective of the present invention is to provide a fan-out chip package and its fabricating method where the vertical connecting components embedded inside the encapsulating layer and only penetrating through the encapsulating layer for easy fabrication and the redistribution layer may not easily be broken.

The second purpose of the present invention is to provide a fan-out chip package and its fabricating method to be implemented in 3D Package-On-Package products to meet the requirements of thinner packages.

DESCRIPTION OF THE DRAWINGS

FIGS. 3A to 3L are cross-sectional views illustrating each step of the fabrication process of the package layer in FIG. 2.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios may be selectively designed and disposed and the detail component layouts may be more complicated.

Figure 1:
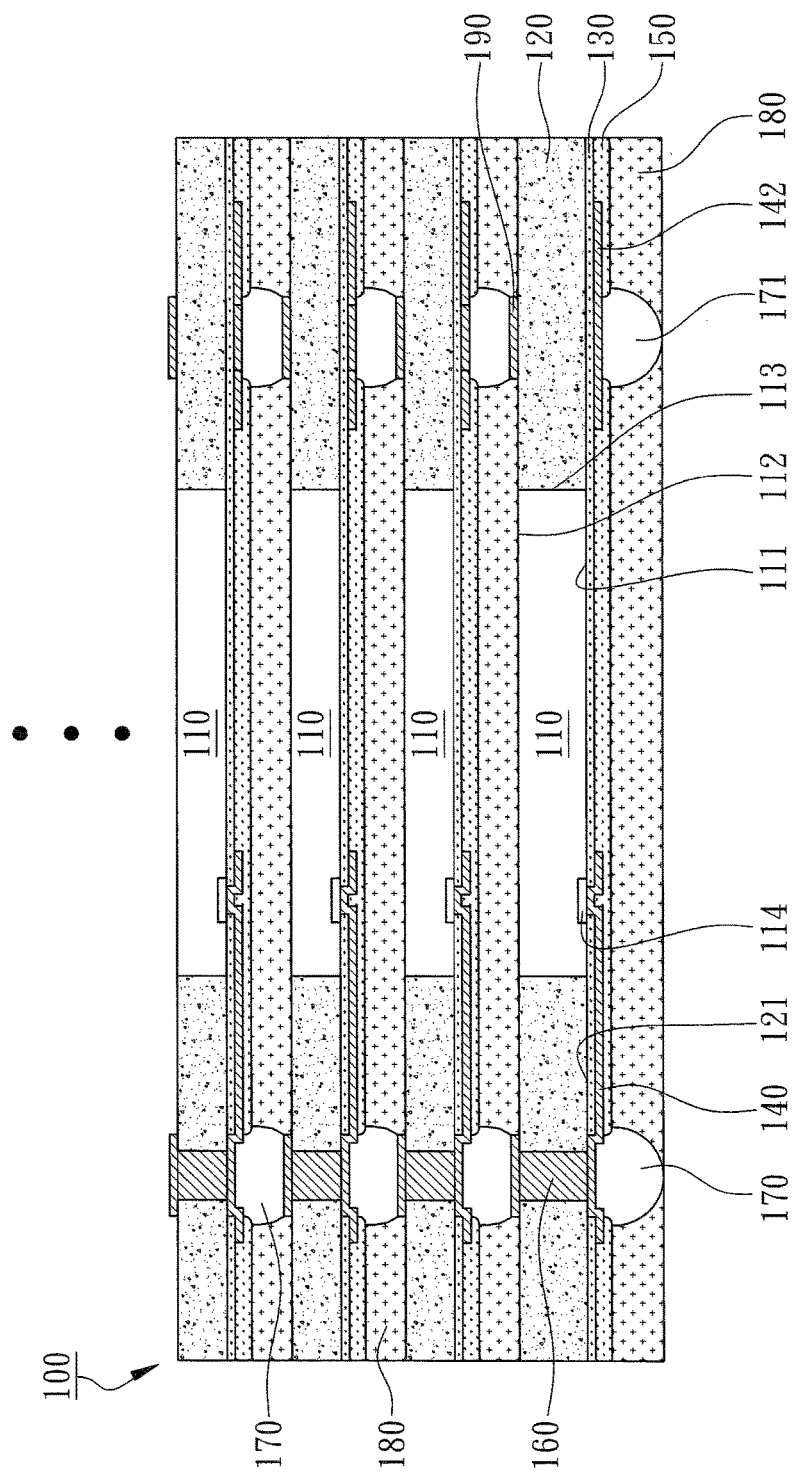
FIG. 1 is a cross-sectional view of a fan-out chip package according to the first embodiment of the present invention.
Figure 2:
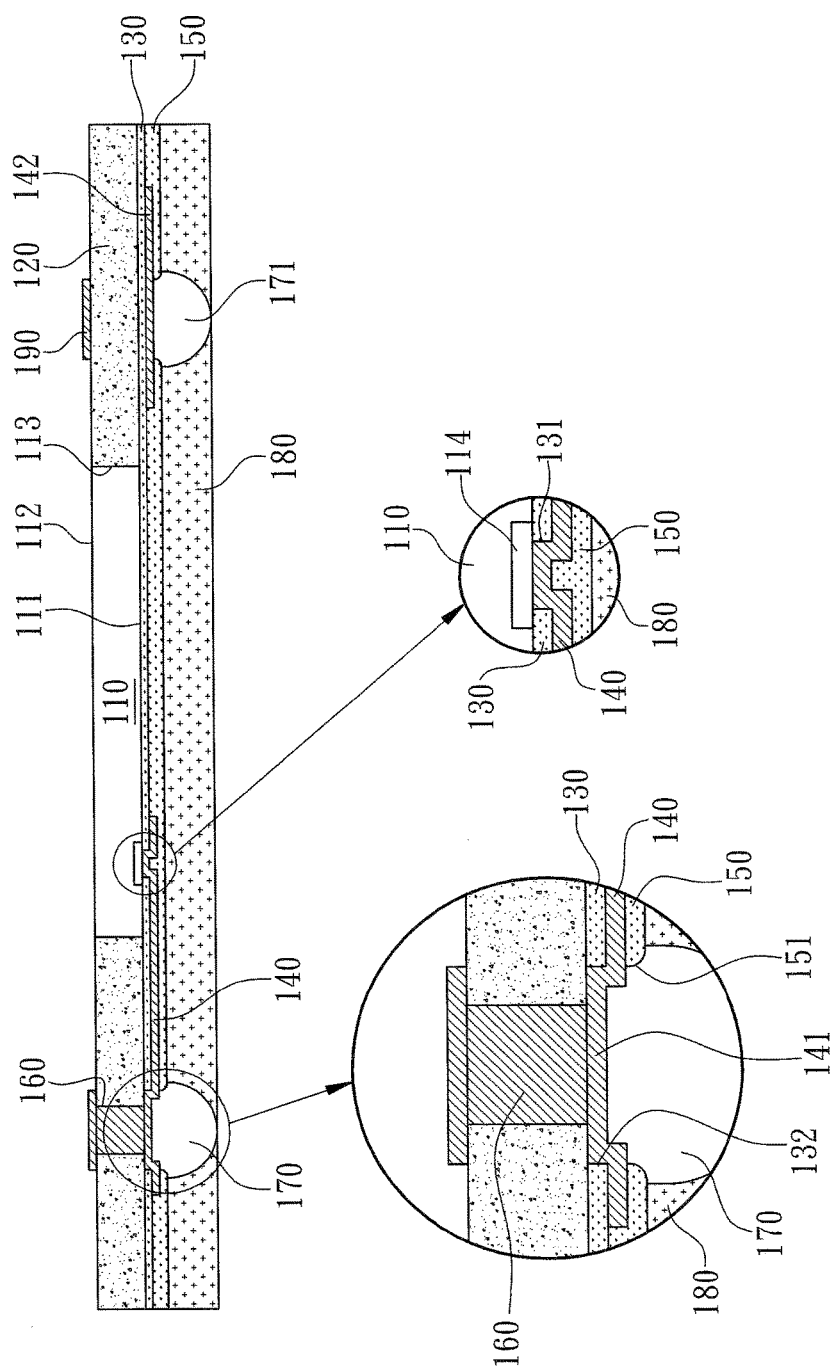
FIG. 2 is a cross-sectional view of one packaging layer of the fan-out chip package in FIG. 1.

FIG. 1 is a cross-sectional view of a fan-out chip package according to the first embodiment of the present invention. FIG. 2 is a cross-sectional view of one packaging layer of the fan-out chip package in FIG. 1. FIGS. 3A to 3L are cross-sectional views illustrating each step of the fabrication process of the package layer in FIG. 2. A fan-out chip package 100 comprises a plurality of packaging layers. Each packaging layer comprises a chip 110, an encapsulation 120, a first passivation layer 130, a redistribution layer 140, a second passivation layer 150 and a plurality of vertical connectors 160.

As shown in FIG. 1 and FIG. 2, the chip 110 has an active surface 111, a back surface 112 and a plurality of sides 113. A plurality of bond pads 114 are disposed on the active surface 111. The chip 110 is a semiconductor based integrated circuit (IC) device. The active surface 111 is the surface of the chip where IC fabrication is implemented. The bond pads 114 may be an aluminum pad, a copper pad, or an alloy pads. The bond pads 114 may be contact points used to electrically couple to the integrated circuit of the chip 110. The back surface 112 is opposite to the active surface 111. The sides 113 are the cutting surfaces formed during singulation of the chip 110.

The encapsulation 120 may encapsulate the sides 113 of the chip 110. The encapsulation 120 may be a thermosetting and electrical insulating Epoxy Molding Compound (EMC). The encapsulation 120 may provide a peripheral surface 121 extending outward from the periphery of the active surface 111. The peripheral surface 121 of the encapsulation 120 is coplanar to the active surface 111. The thickness of the encapsulation 120 may be the same as the thickness of the chip 110. The encapsulation 120 may not encapsulate the active surface 111 and the back surface 112 of the chip 110. The thickness of the encapsulation 120 and the chip 110 may range from 30 μm to 100 μm. In an exemplary embodiment, the thickness of the encapsulation 120 and the chip 110 may be 50 μm.

The first passivation layer 130 is compliantly disposed on the encapsulation 120 and the chip 110. The first passivation layer 130 may cover the active surface 111 of the chip 110 and the peripheral surface 121 of the encapsulation 120. To "compliantly disposing" the first passivation layer 130 on the encapsulation 120 and the chip 110, the encapsulation 120 and the chip 110 may be formed first to be a carrier. The first passivation layer 130 may then be disposed on the carrier through gas deposition or liquid coating without the use of solid attach material. The first passivation layer 130 has a plurality of fan-in openings 131 and a plurality of fan-out openings 132. The fan-in openings 131 expose the bond pads 114. The fan-out openings 132 are disposed on the peripheral surface 121 of the encapsulation 120. The pitch and the diameter of the fan-out openings 132 are greater than the pitch and the diameter of the fan-in openings 131. The material used to form the first passivation layer 130 may be a Polyimide (PI). The thickness of the first passivation layer 130 may range from 3 μm to 20 μm. The Young's Modulus of the first passivation layer 130 may be less than the Young's Modulus of the encapsulation 120. Thus, the first passivation layer may be more elastic than the encapsulation 120.

The redistribution layer 140 is formed on the first passivation layer 130. The fan-out circuitry of the redistribution layer 140 is coupled to the bond pads 114 through the fan-in openings 131 and extends to the fan-out openings 132. The redistribution layer 140 has a plurality of fan-out pads 141 disposed on the peripheral surface 121 of the encapsulation 120 through the fan-out openings 132. In this way, the fan-out pads 141 may be directly coupled to the encapsulation 120. Therefore, the fan-out circuitry of the redistribution layer 140 is directly coupled to the first passivation layer 130 without being in direct contact with the chip 111 and the encapsulation 120. The redistribution layer 140 may be a composite metal layer fabricated using an IC fabrication process. The redistribution layer 140 may include a copper conductive layer having a thickness of 3 μm. A titanium adhesive layer formed having a thickness of 0.1 μm and a copper seed layer having a thickness of 0.2 μm may be disposed under the copper conductive layer. Furthermore, nickel-gold composite metal layer may be disposed on top of the copper conductive layer to enhance anti-oxidation capability and soldering capability of the redistribution layer 140. The nickel may have a thickness of 2 μm and the gold may have a thickness of 0.3 μm. Thus, as compared to the conventional substrate trace layout, the redistribution layer 140 need note use electroplated lines of a conventional substrate for interconnection.

The second passivation layer 150 is formed on the first passivation layer 130 to cover the redistribution layer 140. The second passivation layer 150 has a plurality of connecting holes 151 to expose the fan-out pads 141. The material used to form the second passivation layer 150 may be a Polyimide (PI). The thickness of the second passivation layer 150 ranges from 3 μm to 20 μm. In an exemplary embodiment, the thickness of the second passivation layer 150 may be 5 μm. A redistribution layer structure comprises the first passivation layer 130, the redistribution layer 140 and the second passivation layer 150. The thickness of the redistribution layer structure may be less than or equal to 20μm.

The vertical connectors 160 are embedded inside the encapsulation 120 and coupled to the fan-out pads 141. The vertical connectors 160 may be Through Mold Via (TMV). The material used to form the vertical connectors 160 may include copper, gold, or solder. The shapes of the vertical connectors 160 may be vertical cylinders, vertical lines, or spheres. The height of the vertical connectors 160 may be greater than or equal to the thickness of the encapsulation 120. The vertical connectors 160 are configured to conduct electricity.

The embedded vertical connectors 160 only penetrate through the encapsulation 120 and does not penetrate through the first passivation layer 130 for easy fabrication. Since the redistribution layer 140 is embedded between the first passivation layer 130 and the second passivation layer 150, the redistribution layer 140 is may not easily break. The thickness of a package layer of the fan-out chip package 100 may be less than 100 μm and may be used to reduce the thickness of the fan-out chip package 100 in FIG. 1.

The fan-out chip package 100 may further comprise a plurality of connecting terminals 170. The plurality of connecting terminals 170 may be solder balls or bumps disposed on the fan-out pads 141 through the connecting holes 151 and may protrude from the second passivation layer 150. The connecting terminals 170 are used to couple to the vertical connectors 160 or the contact pads of an adjacent packaging layer. The connecting terminals 170 may only be disposed within the area of the peripheral surface 121 of the encapsulation 120. In this way, the use of Through Silicon Via (TSV) on the chip 110 may be eliminated.

The fan-out chip package 100 may further comprise a non-conductive adhesive layer 180 formed on the second passivation layer 150 and configured to encapsulate the connecting terminals 170. The non-conductive adhesive layer 180 is used to adhere two adjacent packaging layers without forming a gap between them. The material used to form the non-conductive adhesive layer 180 may include curable resin. The thickness of the non-conductive adhesive layer 180 may be greater than or equal to the height of the connecting terminals 170. In some embodiments, the thickness of the non-conductive adhesive layer 180 may be less than or equal to 30 m. The non-conductive adhesive layer 180 may provide electrical insulation and may shrink after curing.

Since, the thickness of one packaging layer of the fan-out chip package 100 may be less than 100 μm, stacking eight packaging layers may form a fan-out chip package 100 having a thickness of less than 1 mm.

The redistribution layer 140 may further comprise a dummy pattern 142. The dummy pattern 142 may be formed on the first passivation layer 130. The dummy pattern 142 may not be used for signal transmission. The dummy pattern 142 may be used for heat dissipation, reinforcement and stack balance. A plurality of dummy terminals 171 may be disposed on the dummy pattern 142 and may protrude from the second passivation layer 150. A plurality of dummy pads 190 may be disposed on the peripheral surface 121 of the encapsulation 120 that is coplanar to the back surface 112. Furthermore, the plurality of dummy pads 190 may be correspondingly aligned to the dummy terminals 171. The dummy terminals 171 may be coupled to the dummy pads 190 of an adjacent packaging layer.

Figure 3A:
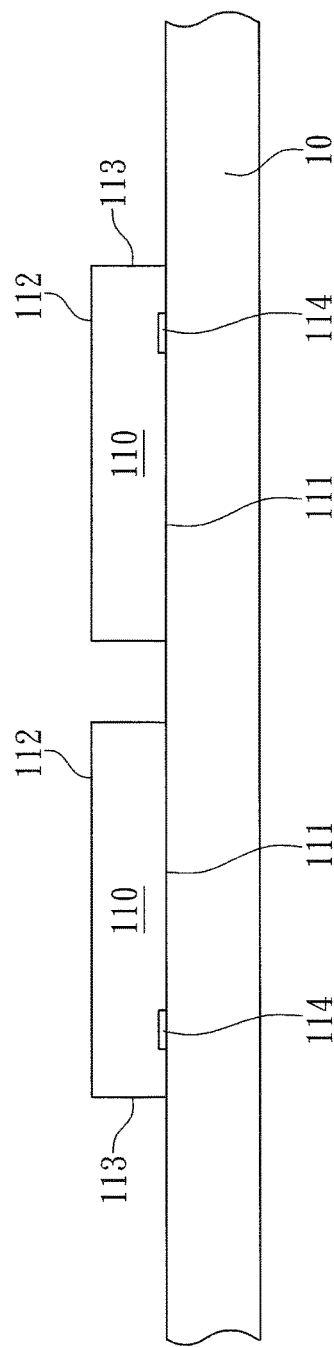

FIGS. 3A to 3L are cross-sectional views illustrating each step of the fabrication process of the package layer in FIG. 2. As shown in FIG. 3A, a chip 110 is disposed on a temporary carrier 10. The chip 110 comprises an active surface 111, a back surface 112 and a plurality of sides 113. A plurality of bond pads 114 are disposed on the active surface 111. The active surface 111 is temporarily adhered to the temporary carrier 10. The temporary carrier 10 is a wafer-level carrier or a panel-level carrier. In some embodiments, the temporary carrier 10 may be a 12 inch glass wafer. The temporary carrier 10 may have an adhesive surface that may provide temporary adhesion. A plurality of chips 110 may temporarily be adhered to the temporary carrier 10 and arranged according to a wafer map using the pick-and-place process. The active surfaces 111 of the chips 110 face toward the temporary carrier 10.

Figure 3B:
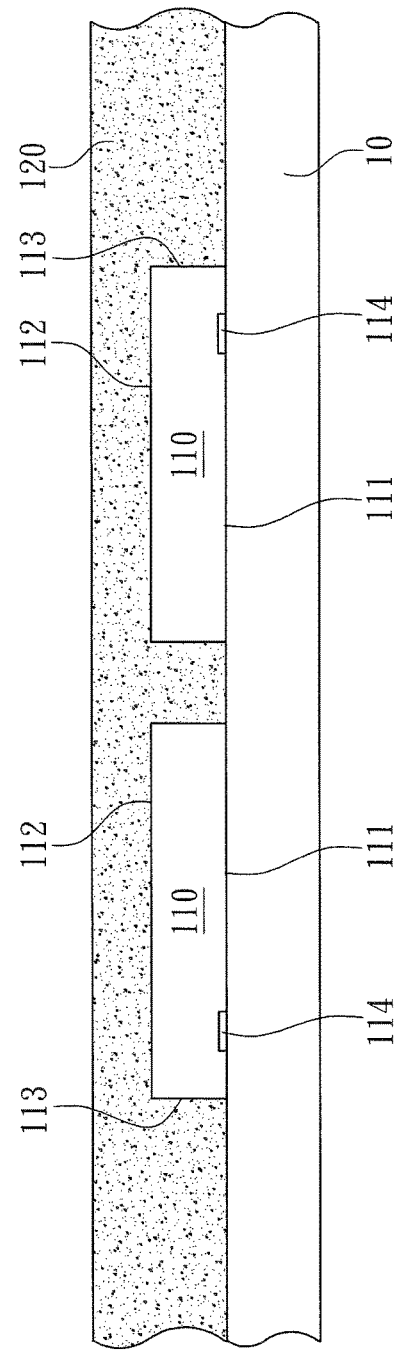

As shown in FIG. 3B, an encapsulation 120 is formed on the temporary carrier 10 using wafer-level molding process or panel-level molding process to encapsulate the chips 110. The encapsulation 120 may encapsulate the sides 113 of the chips 110 and further encapsulate the back surfaces 112 of the chips 110. The shape of the encapsulation 120 may be the same as the temporary carrier 10.

As shown in FIG. 3C, the thickness of the encapsulation 120 is reduced through grinding process. In this way, the thickness of the encapsulation 120 and the chips 110 may be the same. The encapsulation 120 may not cover the active surfaces 111 and the back surfaces 112 of the chips 120. In this step, the thickness of the chips 110 may be simultaneously reduced.

As shown in FIGS. 3C and 3D, the encapsulation 120 is debonded from the temporary carrier 10. The encapsulation 120 provides a peripheral surface 121 extending away from the periphery of the active surface 111. The debonding process may use UV radiation to reduce or eliminate the adhesion of the temporary carrier 10. In this step, the active surfaces 111 of the chips 110 and the peripheral surface 121 of the encapsulation 120 are exposed.

Figure 3E:
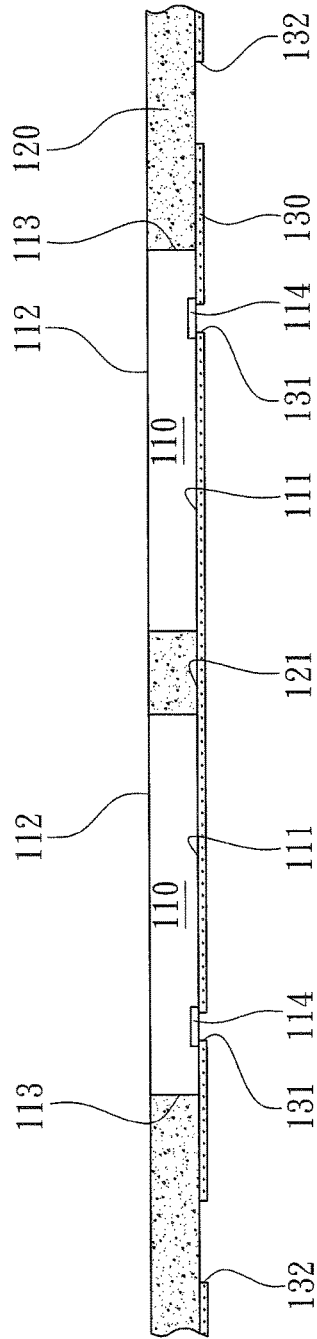

As shown in FIG. 3E, a first passivation layer 130 is formed on the peripheral surface 121 of the encapsulation 120 and the active surfaces of the chips 110 using vapor deposition or spin coating methods. After the first passivation layer 130 is formed, lithography process may be performed on the first passivation layer 130 to form patterns the first passivation layer 130. The pattern includes a plurality of fan-in openings 131 and a plurality of fan-out openings 132. The fan-in openings 131 are recess areas of the first passivation layer 130 configured to expose the bond pads 114. The fan-out openings 132 are recess areas of the first passivation layer 130 formed on the peripheral surface 121 of the encapsulation 120.

Figure 3F:
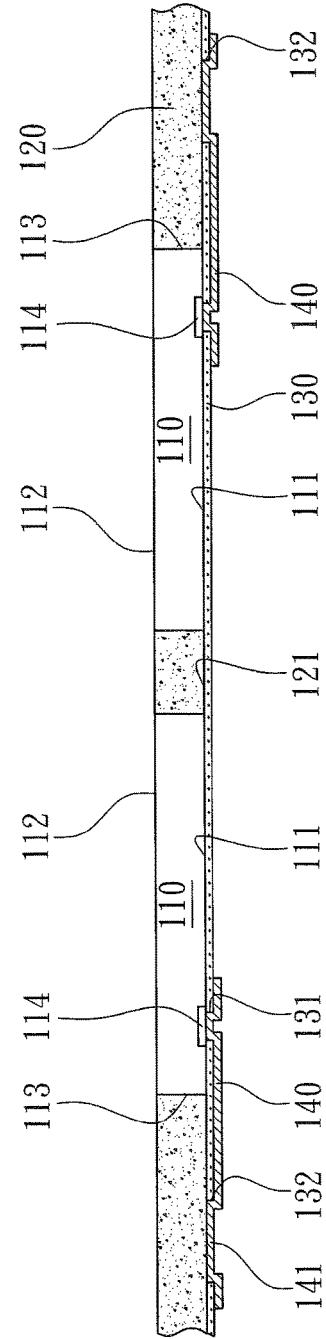

As shown in FIG. 3F, a redistribution layer 140 is formed on the first passivation layer 130 using metal deposition and electroplating process. The redistribution layer 140 is coupled to the bond pads 114 through the fan-in openings 131 and extends to the fan-out openings 132. The redistribution layer 140 has a plurality of fan-out pads 141 disposed on the peripheral surface 121 of the encapsulation 120 through the fan-out openings 132.

As shown in FIG. 3G, a second passivation layer 150 is formed on the first passivation layer 130 using vapor deposition or spin coating process to cover the redistribution layer 140.

Figure 3K:
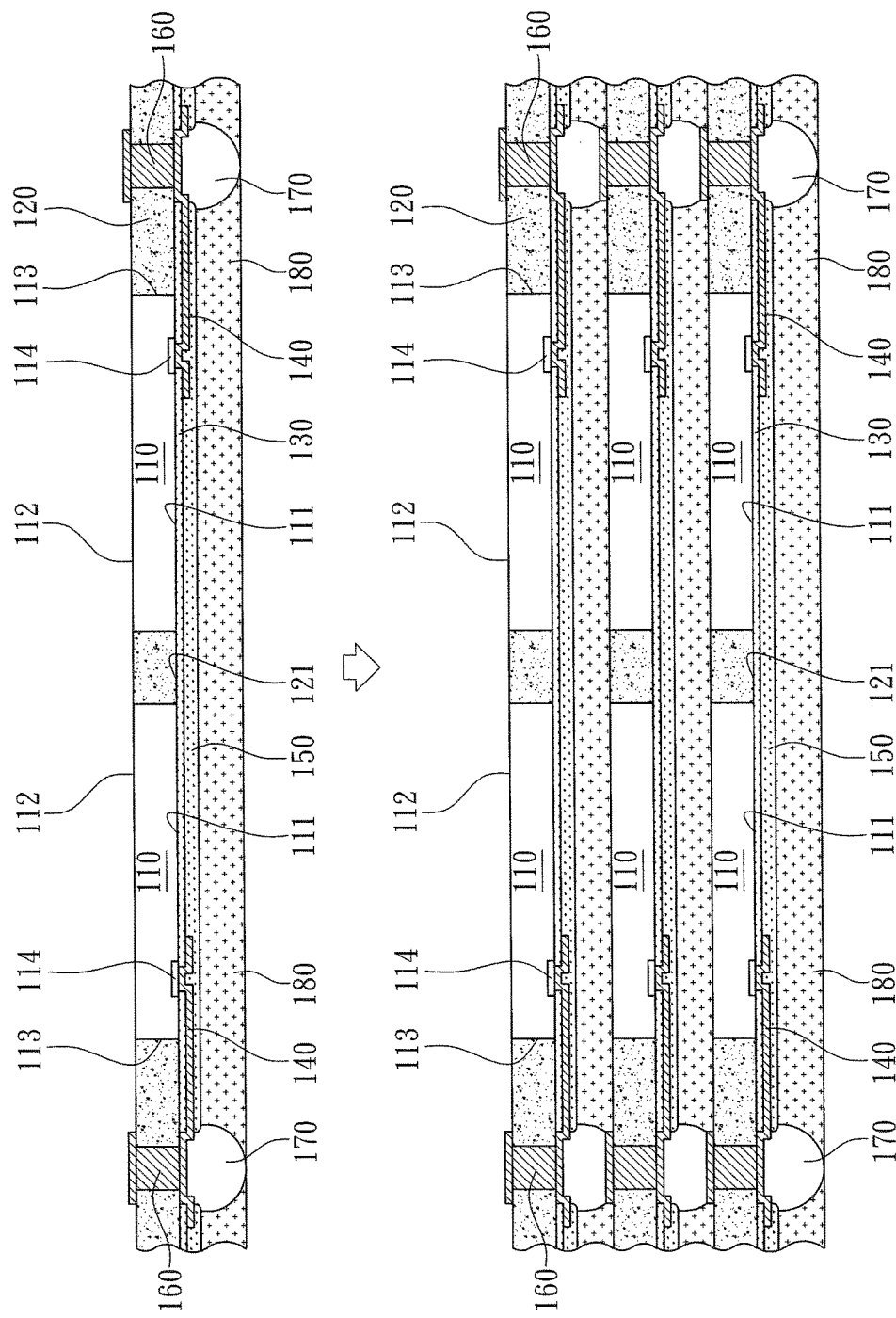

As shown in FIG. 3H, a plurality of through holes 122 are formed on the encapsulation 120 through mechanical drilling or chemical etching. The fan-out pads 141 are exposed at the bottom of the through holes 122. As shown in FIG. 3I, a plurality of vertical connectors 160 are formed inside the through holes 122 through hole electroplating. The vertical connectors 160 are embedded inside the encapsulation 120. And, the vertical connectors 160 are electrically coupled to the fan-out pads 141. The vertical connectors 160 may be slightly protruding from the encapsulation 120. In some other embodiments, contact pads are correspondingly formed on the terminals of the vertical connectors 160. As shown in FIG. 3J, a plurality of connecting terminals 170 are disposed on the fan-out pads 141 of the redistribution layer 140 using electroplating and/or reflow process. The plurality of connecting terminals 170 are protruding from the second passivation layer 150 Moreover, a non-conductive adhesive layer 180 is formed on the second passivation layer 150 through printing or lamination and is configured to encapsulate the connecting terminals 170. In this way, a packaging layer may be formed on wafer-type or in panel-type. As shown in FIG. 3K, a plurality of packaging layers are stacked on each other through wafer-to-wafer lamination or panel-to-panel lamination.

Figure 3L:
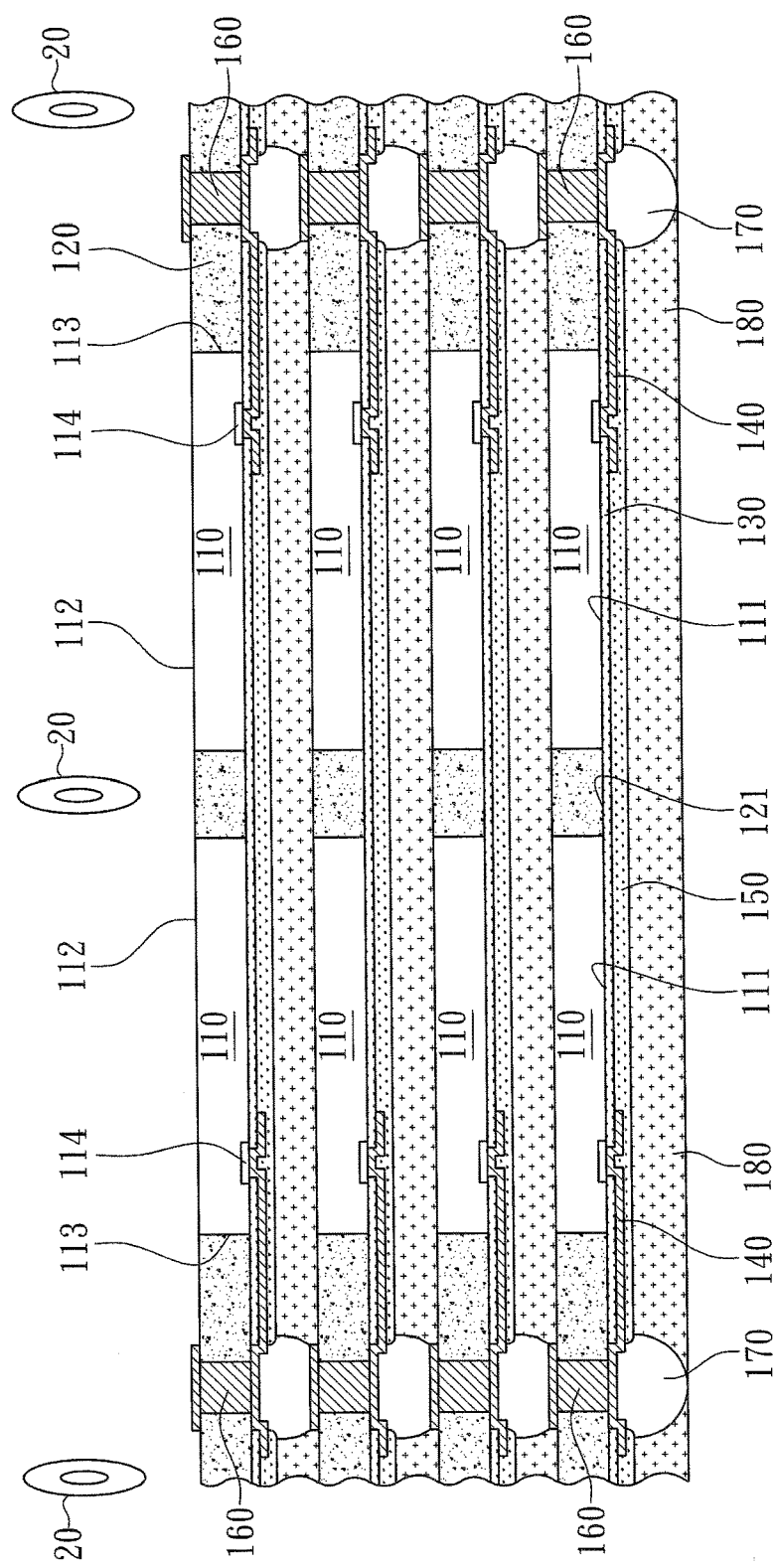

As shown in FIG. 3L, the fabricating method of the fan-out chip package 100 further comprises performing a singulation cutting process on the encapsulation 120 to form a plurality of individual fan-out chip packages 100 as shown in FIG. 1. The singulation cutting process may use a cutting process such as mechanical blade sawing or from laser cutting.

Figure 4:
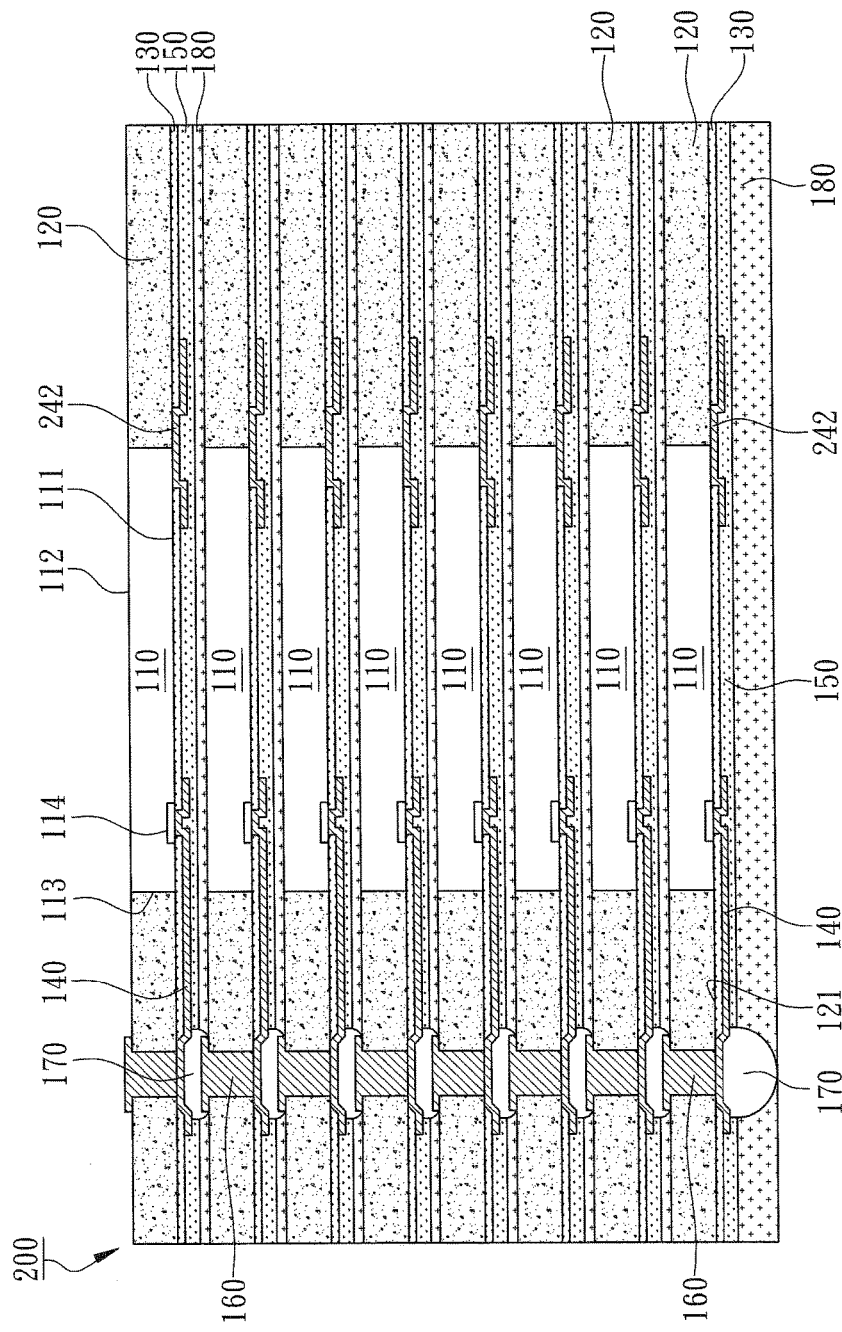
FIG. 4 is a cross-sectional view of another fan-out chip package according to the second embodiment of the present invention.
Figure 5:
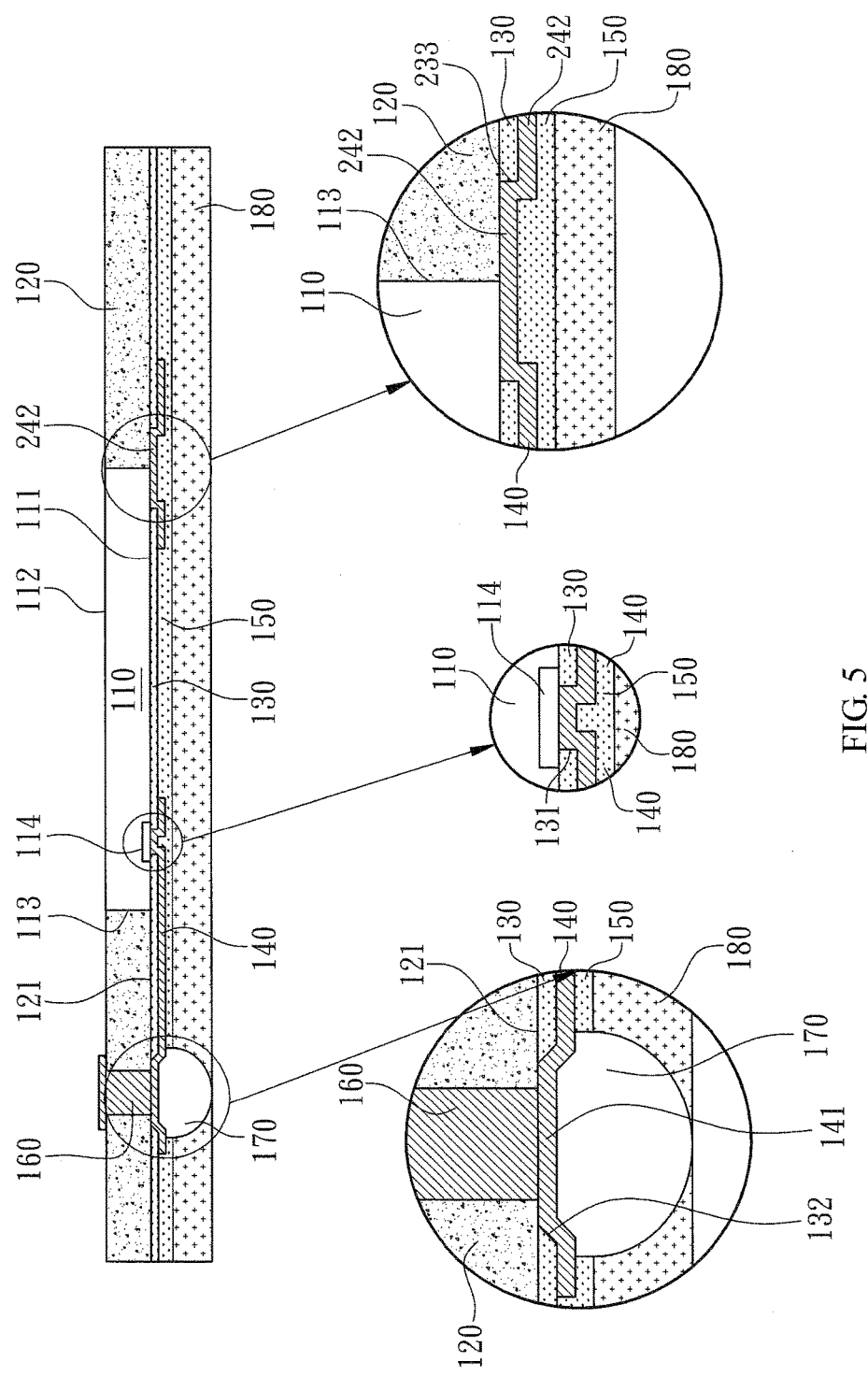
FIG. 5 is a cross-sectional view of one packaging layer of the another fan-out chip package in FIG. 4.

FIG. 4 is a cross-sectional view of another fan-out chip package according to the second embodiment of the present invention. FIG. 5 is a cross-sectional view of one packaging layer of the another fan-out chip package in FIG. 4. Some of components of the fan-out package 200 in FIG. 4 may be numbered and function the same as those of in the fan-out package 100 in FIG. 1. Thus, the components are no longer described for brevity. The fan-out chip package 200 comprises of a plurality of packaging layers. Each packaging layer comprises a chip 110, an encapsulation 120, a first passivation layer 130, a redistribution layer 140, a second passivation layer 150 and a plurality of vertical connectors 160.

As shown in FIGS. 4 and 5, the chip 110 has an active surface 111, a back surface 112 and a plurality of sides 113. A plurality of bond pads 114 are disposed on the active surface 111. The encapsulation 120 encapsulates the sides 113 of the chip 110. The encapsulation 120 further provides a peripheral surface 121 that extends from the periphery of the active surface 111. The thickness of the encapsulation 120 and the thickness of the chip 110 may be the same. In this way, the encapsulation 120 does not encapsulate the active surface 111 and the back surface 112 of the chip 110.

The first passivation layer 130 is formed on the active surface 111 of the chip 110 and the peripheral surface 121 of the encapsulation 120. The first passivation layer 130 has a plurality of fan-in openings 131 and a plurality of fan-out openings 132. The fan-in openings 131 are used to expose the bond pads 114. The fan-out openings 132 are disposed on the peripheral surface 121 of the encapsulation 120. The redistribution layer 140 is formed on the first passivation layer 130. The redistribution layer 140 is coupled to the bond pads 114 through the fan-in openings 131 and extends to the fan-out openings 132. The redistribution layer 140 has a plurality of fan-out pads 141 disposed on the peripheral surface 121 of the encapsulation 120 through the fan-out openings 132. The second passivation layer 150 is formed on the first passivation layer 130 to cover the redistribution layer 140. The vertical connectors 160 are encapsulated by the encapsulation 120 and coupled to the fan-out pads 141.

The fan-out chip package 200 further comprises a plurality of connecting terminals 170 disposed on the fan-out pads 141. The plurality of connecting terminals 170 are protruding from the second passivation layer 150. A non-conductive adhesive layer 180 is formed on the second passivation layer 150 to encapsulate the connecting terminals 170.

In the second embodiment, the redistribution layer 140 further includes a dummy pattern 242. The first passivation layer 130 may further include a slotted hole 233 configured to expose the seam between the active surface 111 of the chip 110 and the peripheral surface 121 of the encapsulation 120. The slotted hole 233 may be filled with the dummy pattern 242. The dummy pattern 242 may increase the stress resistance of the active surface 111 of the chip 110. Moreover, damages on the dummy pattern 242 may not affect electrical connections.

The present invention presents a fan-out chip package 200 having vertical connectors 160 that are only penetrating through the encapsulation 120 for easy fabrication. In this way, the redistribution layer 140 may not easily be broken. Furthermore, the total thickness of a package-on-package product may be reduced.

The above description of embodiments of this invention is intended to be illustrative but not limited. Other embodiments of this invention may be obvious to those skilled in the art in view of the above disclosure which still may be covered by and within the scope of the present invention even with any modifications, equivalent variations and adaptations.

What is claimed is:

1. A method of fabricating a packaging layer of an fan-out chip package comprising:
    disposing a chip on a temporary carrier, wherein the chip has an active surface facing the temporary carrier, a back surface opposite the active surface, and a plurality of sides formed between the active surface and the back surface, the active surface having a plurality of bond pads;
    forming an encapsulation on the temporary carrier to encapsulate the chip, wherein the encapsulation has a peripheral surface formed according to a surface of the temporary carrier;
    grinding the encapsulation and the chip to form the back surface of the chip and a back surface of the encapsulation, wherein the back surface of the chip and the back surface of the encapsulation are coplanar to each other;
    debonding the encapsulation and the chip from the temporary carrier;
    forming a first passivation layer on the active surface of the chip and the peripheral surface of the encapsulation;
    patterning the first passivation layer to form a plurality of fan-in openings and a plurality of fan-out openings on the first passivation layer, wherein the fan-in openings are configured to expose the bond pads and the fan-out openings are configured to expose part of the peripheral surface;
    forming a redistribution layer on the first passivation layer, wherein a part of the redistribution layer are formed in the plurality of fan-in openings and another part of the redistribution layer are formed in the plurality of fan-out openings, wherein the part of the redistribution layer formed in the plurality of fan-in openings are configured to electrically couple to the plurality of bond pads of the chip and the another part of the redistribution layer formed in the plurality of fan-out openings are fan-out pads configured to physically couple to the peripheral surface of the encapsulation, wherein the redistribution layer has a dummy pattern formed on the first passivation layer;
    forming a second passivation layer on the first passivation layer and the redistribution wiring layer;
    forming a plurality of vertical connectors within the encapsulation to correspondingly couple to the fan-out pads; and
    disposing a plurality of dummy terminals on the dummy pattern.

2. The method as claimed in claim 1, wherein forming a plurality of vertical connectors within the encapsulation to correspondingly couple to the fan-out pads comprises:
    forming a plurality of through holes on the encapsulation, each of the through holes being aligned to a corresponding fan-out pad; and
    filling the through holes with a conductive material to form the vertical connectors.

3. The method as claimed in claim 1, further comprising:
    disposing a plurality of connecting terminals on the fan-out pads, wherein the plurality of connecting terminals are protruding from the second passivation layer.

4. The method as claimed in claim 3, further comprising:
    forming a non-conductive adhesive layer on the second passivation layer to encapsulate the connecting terminals.

5. The method as claimed in claim 3, further comprising:
    forming a plurality of dummy pads on the back surface of the encapsulation and/or the back surface of the chip, wherein each of the plurality of dummy pads are vertically aligned to a corresponding dummy terminal.

6. The method as claimed in claim 1, wherein the temporary carrier is a wafer or a panel and the encapsulation takes a shape of the temporary carrier when formed.

7. The method as claimed in claim 1, further comprising:
    laminating a plurality of packaging layers on each other to form the fan-out chip package.

8. The method as claimed in claim 7, further comprising:
    performing singulation on the fan-out chip package to form a plurality of individual fan-out chip packages.

* * * * *